US008649118B1

(12) United States Patent
Chang et al.

(10) Patent No.: US 8,649,118 B1
(45) Date of Patent: Feb. 11, 2014

(54) PATTERN-DEPENDENT LLR MANIPULATION

(71) Applicant: LSI Corporation, Milpitas, CA (US)

(72) Inventors: Wu Chang, Sunnyvale, CA (US); Fan Zhang, Milpitas, CA (US); Jun Xiao, Fremont, CA (US)

(73) Assignee: LSI Corporation, San Jose, CA (US)

( * ) Notice: Subject to any disclaimer, the term of this patent is extended or adjusted under 35 U.S.C. 154(b) by 0 days.

(21) Appl. No.: 13/626,030

(22) Filed: Sep. 25, 2012

(51) Int. Cl.
*G11B 5/02* (2006.01)
(52) U.S. Cl.
USPC .............................................. 360/25; 360/27
(58) Field of Classification Search
None
See application file for complete search history.

(56) References Cited

U.S. PATENT DOCUMENTS

| 8,046,669 | B2 * | 10/2011 | Graef et al. | 714/780 |
| 8,130,618 | B2 * | 3/2012 | Maeto | 369/59.22 |
| 8,151,171 | B2 | 4/2012 | Blanksby | |
| 2003/0174426 | A1 * | 9/2003 | Akamatsu | 360/46 |
| 2008/0151405 | A1 * | 6/2008 | Kurtas et al. | 360/31 |

* cited by examiner

*Primary Examiner* — Paul Huber
(74) *Attorney, Agent, or Firm* — Suiter Swantz pc llo (57) ABSTRACT

Methods are provided for pattern-dependent log likelihood ratio (LLR) manipulation of a hard disk drive detector output. Generally, by observing a pattern dependency of LLRs, various rules for LLR manipulation at the detector output are outlined. The rules may provide more reliable LLR values, such as by improving signal-to-noise ratio (SNR) of the hard disk drive detector output.

20 Claims, 6 Drawing Sheets

PATTERN-DEPENDENT LLR MANIPULATION

FIELD

The present disclosure generally relates to the field of disk drive systems, and more particularly hard disk drive signal processing involving manipulation of log likelihood ratio (LLR) values at a channel detector output based upon distributions of known data.

BACKGROUND

The output of a hard disk drive detector can include errors, due in part to physical imperfections of the disk, jitter on detected channels which may impose noise on transition patterns, and the like. Detectors may process channel samples and generate a series of reliability information, such as in the form of soft bit decisions, including log likelihood ratios (LLRs). There is a need to ensure that the LLR values are reliable in order to minimize the error of the detector output.

SUMMARY

Accordingly, an embodiment of the present disclosure is directed to a method for pattern-dependent LLR manipulation. The method includes collecting a set of LLR distribution data, determining at least one of a threshold or a threshold range for each symbol of the LLR distribution data based on the set of the LLR distribution data, and monitoring an output of the hard disk drive detector. The output includes a plurality of symbols corresponding to the output. The method also includes applying a first rule to each symbol of the plurality of symbols corresponding to the output. The first rule includes determining whether one of a plurality of signature events occurred. Each signature event of the plurality of signature events includes a hard decision for a true value based upon LLR distribution patterns. When one of the plurality of signature events is determined to occur, the method includes setting a first LLR value of a symbol of the set of LLR distribution data to zero and applying a first penalty value to any other LLR value of the symbol that equals zero. The method also includes applying a second rule to each symbol of the plurality of symbols corresponding to the output. The second rule includes determining whether one of the plurality of signature events involves all but one LLR value of the symbol in the hard decision occurred. When one of the plurality of signature events which involves all but one LLR value of the symbol in the hard decision is determined to occur, the method includes applying a second penalty value to all LLR values but the one LLR value.

A further embodiment of the present disclosure is directed to a computer-readable device having computer-executable instructions for is performing a method for log likelihood ratio (LLR) manipulation of a hard disk drive detector output, where the method includes collecting a set of LLR distribution data, determining at least one of a threshold or a threshold range for each symbol of the LLR distribution data based on the set of the LLR distribution data, and monitoring an output of the hard disk drive detector. The output includes a plurality of symbols corresponding to the output. The method also includes applying a first rule to each symbol of the plurality of symbols corresponding to the output. The first rule includes determining whether one of a plurality of signature events occurred. Each signature event of the plurality of signature events includes a hard decision for a true value based upon LLR distribution patterns. When one of the plurality of signature events is determined to occur, the method includes setting a first LLR value of a symbol of the set of LLR distribution data to zero and applying a first penalty value to any other LLR value of the symbol that equals zero. The method also includes applying a second rule to each symbol of the plurality of symbols corresponding to the output. The second rule includes determining whether one of the plurality of signature events involves all but one LLR value of the symbol in the hard decision occurred. When one of the plurality of signature events which involves all but one LLR value of the symbol in the hard decision is determined to occur, the method includes applying a second penalty value to all LLR values but the one LLR value.

An additional embodiment of the present disclosure is directed to a method for log likelihood ratio (LLR) manipulation of a hard disk drive detector output. The method includes collecting a set of LLR distribution data, determining at least one of a threshold or a threshold range for each symbol of the LLR distribution data based on the set of the LLR distribution data, and monitoring an output of the hard disk drive detector. The output includes a plurality of symbols corresponding to the output, wherein each symbol includes an LLR0 value, an LLR1 value, an LLR2 value, and an LLR3 value. The method also includes determining whether one of a first signature event, a second signature event, a third signature event, or a fourth signature event occurred for a symbol. The first signature event includes the LLR2 value less than an LLR2 threshold value and the LLR3 value less than an LLR3 threshold value, the second signature event includes the LLR0 value less than an LLR0 threshold value, the LLR3 value less than the LLR3 threshold value, and the LLR2 value between a second LLR2 threshold value and a third LLR2 threshold value, the third signature event includes the LLR0 value less than the LLR0 threshold value, the LLR3 value less than the LLR3 threshold value, and the LLR1 value between a first LLR1 threshold value and a second LLR1 threshold value, and the fourth signature event includes the LLR0 value less than a second LLR0 threshold and the LLR3 value greater than the LLR3 threshold value. The method further includes, when one of the first signature event, the second signature event, the third signature event, or the fourth signature event is determined to occur for the symbol: determining which one of the first signature event, the second signature event, the third signature event, or the fourth signature event occurred and determining whether LLR0, LLR1, LLR2, or LLR3 is equal to zero, and if the first signature event is determined to occur, setting the LLR0 value to zero, and if LLR1 is determined to equal zero, applying a first penalty value to LLR1, if the second signature event is determined to occur, setting the LLR1 value to zero, and applying a second penalty value to the LLR0 value, the LLR2 value, and the LLR3 value, if the third signature event is determined to occur, setting the LLR2 value to zero, and applying a third penalty value to the LLR0 value, the LLR1 value, and the LLR3 value, and if the fourth signature event is determined to occur, setting the LLR3 value to zero, and if LLR1 is determined to equal to zero, is applying a fourth penalty value to LLR1, and if LLR2 is determined to equal to zero, applying a fifth penalty value to LLR2.

It is to be understood that both the foregoing general description and the following detailed description are exemplary and explanatory only and are not necessarily restrictive of the disclosure as claimed. The accompanying drawings, which are incorporated in and constitute a part of the specification, illustrate an embodiment of the disclosure and together with the general description, serve to explain the principles of the disclosure.

BRIEF DESCRIPTION OF THE DRAWINGS

The numerous advantages of the present disclosure may be better understood by those skilled in the art by reference to the accompanying figures in which.

DETAILED DESCRIPTION

Reference will now be made in detail to the presently preferred embodiments of the present disclosure, examples of which are illustrated in the accompanying drawings.

The present disclosure provides implementations for pattern-dependent log likelihood ratio (LLR) manipulation of a hard disk drive detector output. Generally, by observing a pattern dependency of LLRs, various rules for LLR manipulation at the detector output are outlined. The rules may provide more reliable LLR values, such as by improving signal-to-noise ratio (SNR) of the hard disk drive detector output.

Figure 1A:
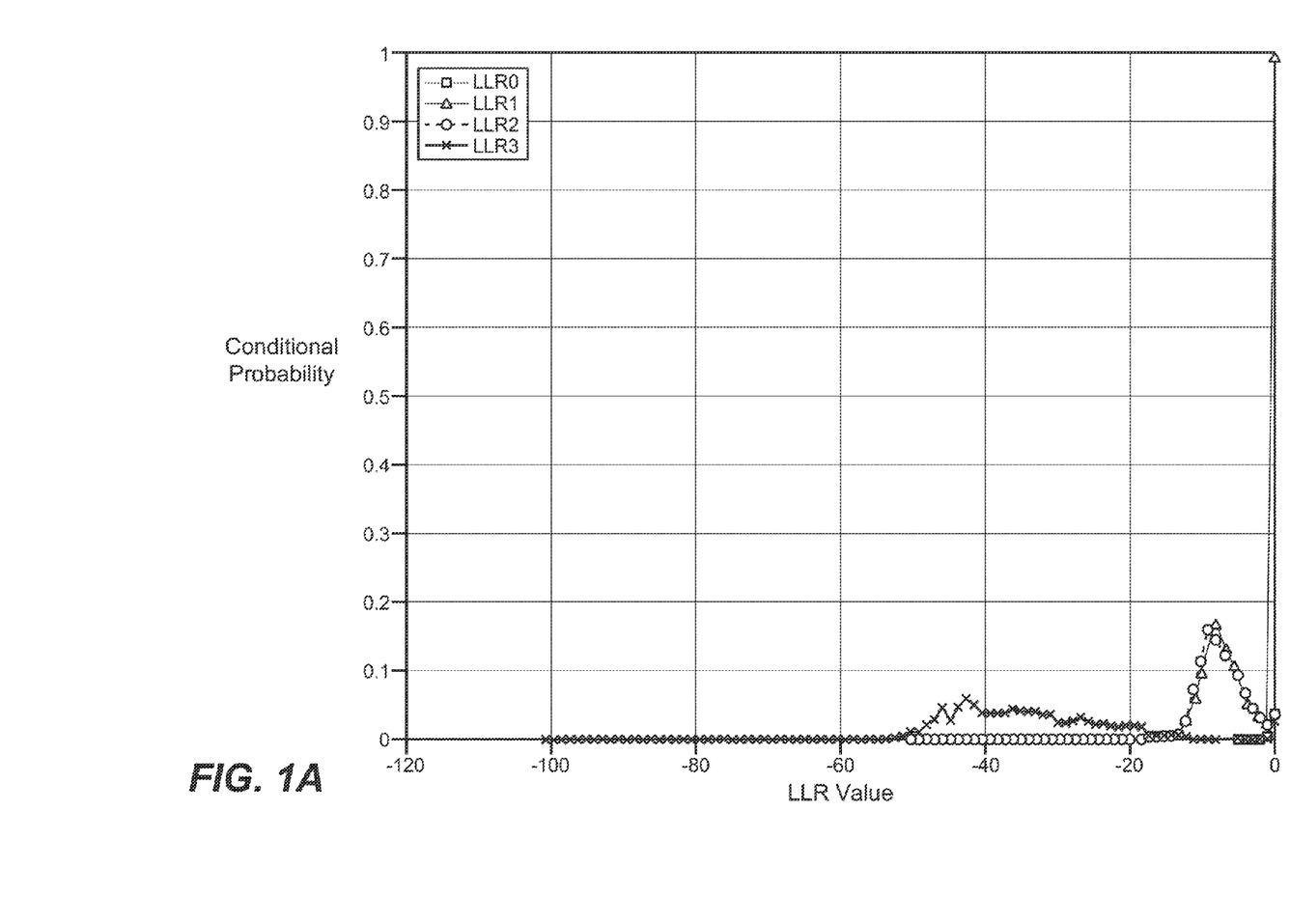
FIG. 1A is a chart of example display detector output LLR distributions based on a true value of 0.
Figure 1B:
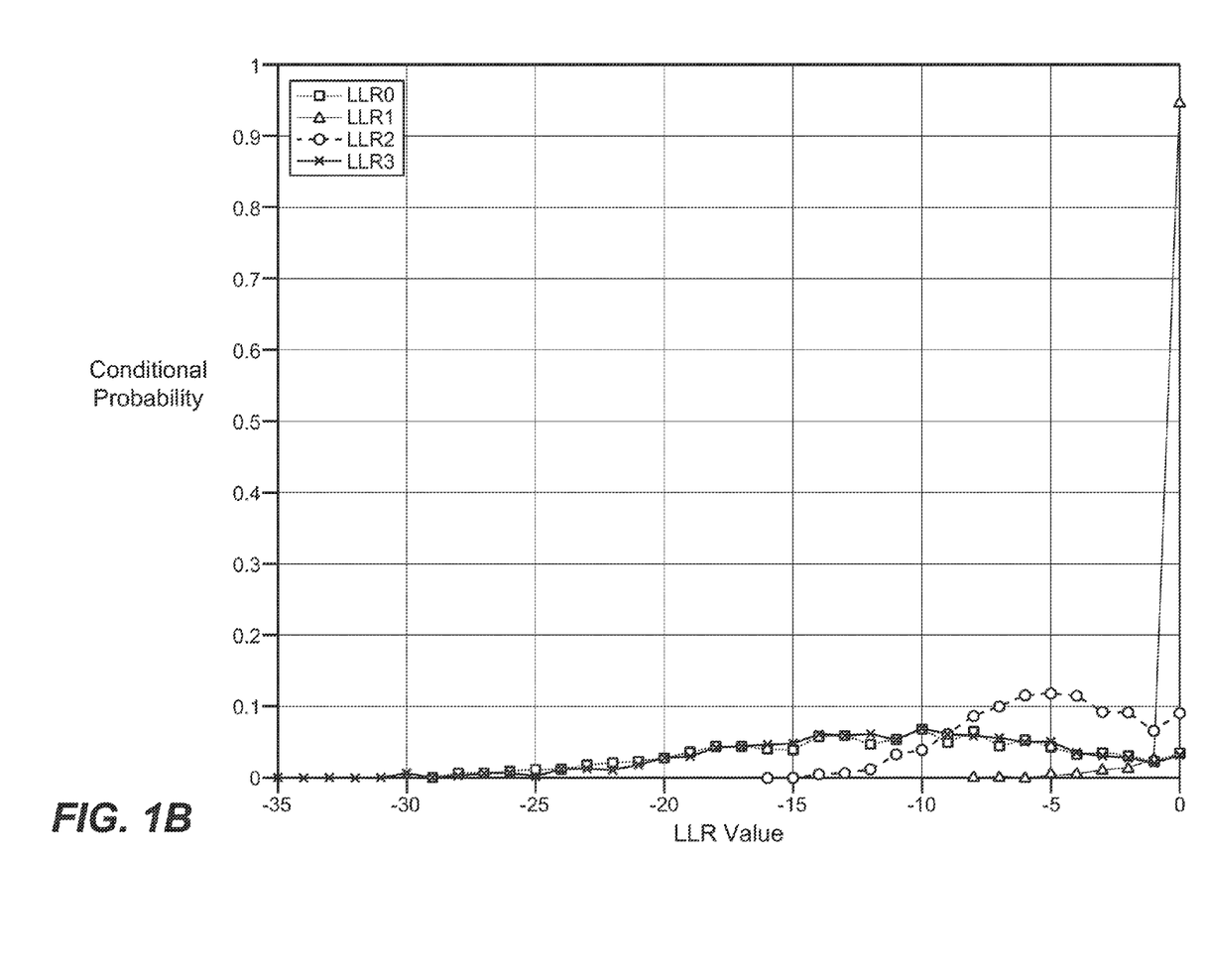
FIG. 1B is a chart of example display detector output LLR distributions based on a true value of 1.
Figure 1C:
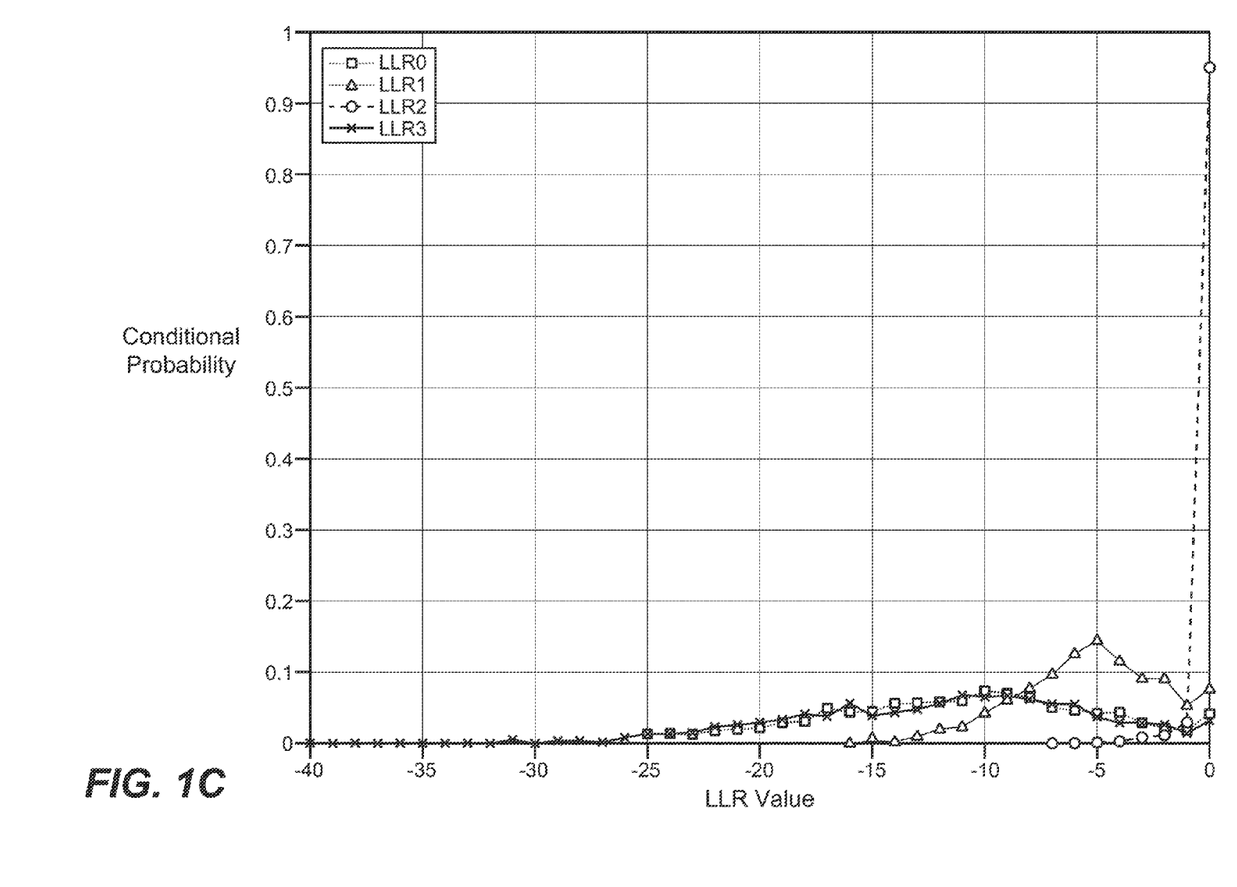
FIG. 1C is a chart of display example detector output LLR distributions based on a true value of 2.
Figure 1D:
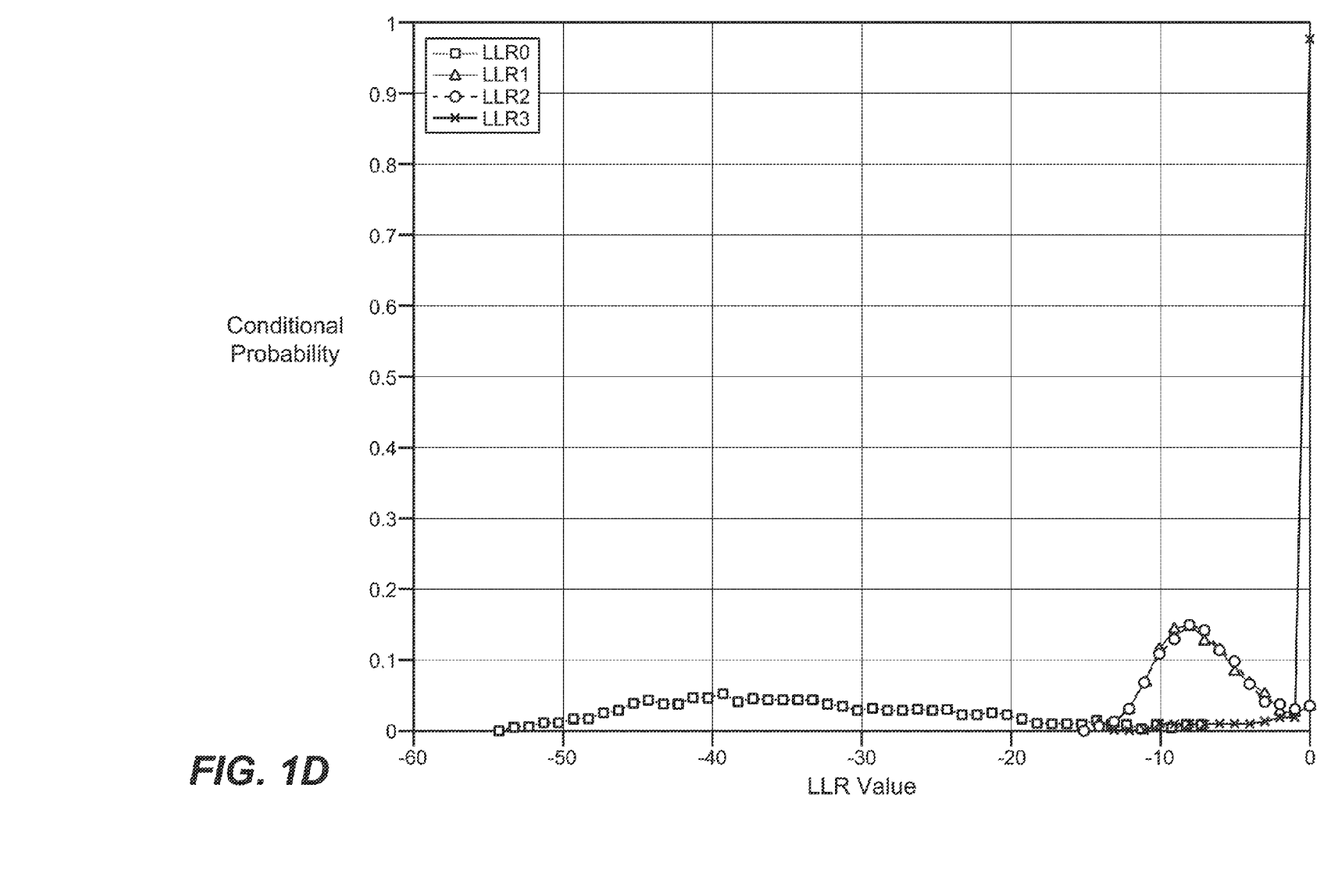
FIG. 1D is a chart of display example detector output LLR distributions based on a true value of 3.

For a detector codec operating based on Galois field (GF) symbols, the LLR of a GF(4) symbol may be denoted as: [LLR0, LLR1, LLR2, LLR3], where LLR0 represents the log likelihood that a symbol is 0, LLR1 represents the log likelihood that a symbol is 1, LLR2 represents the log likelihood that a symbol is 2, and LLR3 represents the log likelihood that a symbol is 3. A jitter dominant detector output channel may impose noise on transition patters, which may cause pattern dependency of the output LLRs. The LLR distribution can differ based on the true value, as shown in FIGS. 1A-1D, which display detector output LLR distributions based on a true value of 0 (FIG. 1A), a true value of 1 (FIG. 1B), a true value of 2 (FIG. 1C), and a true value of 3 (FIG. 1D). Certain error events are pattern dependent. For instance, for true data equal to zero or three, the most probable error is a 1-bit flip error event. Another example is for true data equal to one or two, the most probable error is a 2-bit flip error event. While these patterns are attributable in situations with known true data, the true data may not always be readily available or known. In these situations, pattern-dependent rules may be utilized to ascertain a signature of certain true data. For instance, some errors have non-overlapping supports which can be used to ascertain a signature. As provided herein and with particular reference to FIGS. 2A-2C, the LLR at the detector output may be manipulated based on various rules to improve SNR of the detector output.

Figure 2A:
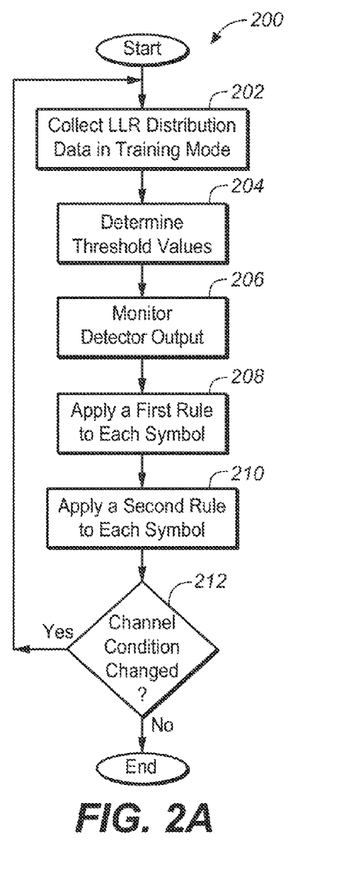
FIG. 2A is a flow diagram for manipulating LLRs from a hard disk drive detector in accordance with an implementation of the present disclosure.

Referring to FIG. 2A, a flow diagram 200 for manipulating LLRs from a hard disk drive detector in accordance with an implementation of the present disclosure is shown. After a start operation, step 202 collects LLR distribution data. For instance, LLR values from a hard disk drive detector output may be collected to produce an LLR histogram (such as those shown in FIGS. 1A-1D). It is contemplated that the data collection may occur in a training mode, which can be done in a known data mode, where what was written to the hard disk drive is known, or in a normal mode, where decoder output is collected to obtain true data. In a particular implementation, collected data is derived solely from successfully decoded sectors of the hard disk drive. The LLR distribution can be frozen after the training mode (e.g., after obtaining a set of distributions for each zone on the hard disk drive, or the LLR distribution can be updated on the fly with true data from decoder output (e.g., the LLR distribution is updated from sector to sector). Step 204 may determine at least one of a threshold or a threshold range for each symbol of the LLR distribution data based on the set of the LLR distribution data. The threshold values provided herein are explanatory. It is contemplated that other threshold values may occur, where the threshold values presented herein are not the only threshold values possible. Step 206 may monitor an output of the hard disk drive channel detector, where the output includes a plurality of symbols is corresponding to the output. Step 208 involves applying a first rule to every symbol (e.g., LLRi, where i=0-3) corresponding to the output. The first rule involves determining whether a condition or signature event involving LLR values has occurred. When the condition or signature event occurs, an LLR value corresponding with the condition or signature event is set to zero, and if any LLRi value is equal to zero (other than the value set to zero in this rule), then a penalty value is applied to that LLRi value. In particular implementation, the penalty value is −4, but it is contemplated that the value of the penalty may differ depending on a desired tolerance level or the like. The conditions or signature events include the following (with example threshold values shown):

First condition ("SIG0"): LLR2 less than −20 and LLR3 less than −20; the true value is 0.

Second condition ("SIG1"): LLR0 less than −20, LLR3 less than −20, and LLR2 between −15 and −10; the true value is 1.

Third condition ("SIG2"): LLR0 less than −20, LLR3 less than −20, and LLR1 between −15 and −10; the true value is 2.

Fourth condition ("SIG3"): LLR0 less than −40 and LLR3 greater than −30; the true value is 3.

Figure 2B:
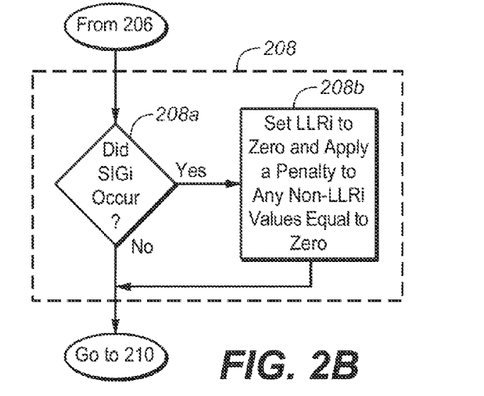
FIG. 2B is a flow diagram of the first rule applied in FIG. 2A.

The conditions or signature events may not co-exist, such that either one condition or signature event occurs or no condition or signature event occurs. Stated another way, the conditions or signature events are mutually exclusive. For example, if SIG1 occurs for a particular detector output symbol, such that LLR0 is less than −20, LLR3 is less than −20, and LLR2 is between −15 and −10, then none of SIG0, SIG2, or SIG3 will occur for that symbol. In accordance with these conditions or signature events, the first rule may be stated as: for i=0 to 3, if condition or signature event SIGi occurs, then set LLRi to 0, and if applicable, apply a penalty to any non-LLRi values that are equal to 0. This is shown with regard to FIG. 2B, which shows the step 208 in detail as steps 208a and 208b. In particular, step 208a determines whether a condition or signature event occurs (i.e., did SIGi occur?). If it is determined in step 208a that SIGi did not occur, FIG. 2B illustrates the flow proceeding to step 210 (shown in FIG. 2A). While FIG. 2B illustrates the flow proceeding to step 210, it is contemplated that the flow may alternatively proceed to the start operation or step 202 of FIG. 2A. If it is determined in step 208a that SIGi did occur, the flow proceeds to step 208b.

In step 208b, the LLRi corresponding with SIGi (e.g., LLR1 corresponds with SIG1; LLR3 corresponds with SIG3, etc.) is set to zero, and any other LLR value (other than the LLRi corresponding with SIGi) that equals zero is applied a penalty value. After step 208b, the flow proceeds to step 210 (shown in FIG. 2A).

As an example for the application of the first rule at step 208, if it is determined that the fourth condition or signature event (SIG3) occurs, then the value of LLR3 is set to zero, and if LLR1 is equal to zero, a penalty value is applied to LLR1, and if LLR2 is equal to zero, a penalty value is applied to LLR2. In this example, the value of LLR0 should not equal zero since if SIG3 occurred, the value of LLR0 should be less than −40. Therefore no penalty should be applied to LLR0 when SIG3 occurs.

As another example of the application of the first rule at step 208, if it is determined that the first condition or signature event (SIG0) occurs, then the value of LLR0 is set to zero, and if LLR1 is determined to equal zero, then a penalty value is applied to LLR1. In this example, the values of LLR2 and LLR3 should not equal zero since if SIG0 occurred, the values of LLR2 and LLR3 should each be less than −20. Therefore no penalty should be applied to LLR2 or LLR3 when SIG0 occurs.

Step 210 of FIG. 2 involves applying a second rule to every symbol (e.g., LLRi, where i=0-3) corresponding to the output. In a particular implantation, the second rule may be stated as: if SIG1 or SIG2 occurs, the hard decision is unchanged, and LLRs that are unrelated to hard decisions are adjusted by a penalty value. For instance, for the hard decision related to SIG1, where upon occurrence of the conditions of SIG1, the true value is 1, the LLRs that are unrelated to the hard decision are LLR0, LLR2, and LLR3. Similarly, for the hard decision related to SIG2, where upon occurrence of the conditions of SIG2, the true value is 2, the LLRs that are unrelated to the hard decision are LLR0, LLR1, and LLR3. Accordingly, when applying the second rule, when SIG1 occurs, the values of LLR0, LLR2, and LLR3 would be adjusted by a penalty value, and when SIG2 occurs, the values of LLR0, LLR1, and LLR3 would be adjusted by a penalty value. In a particular implementation, the penalty value is −10, but it is contemplated that the value of the penalty may differ depending on a desired tolerance level or the like.

Figure 2C:
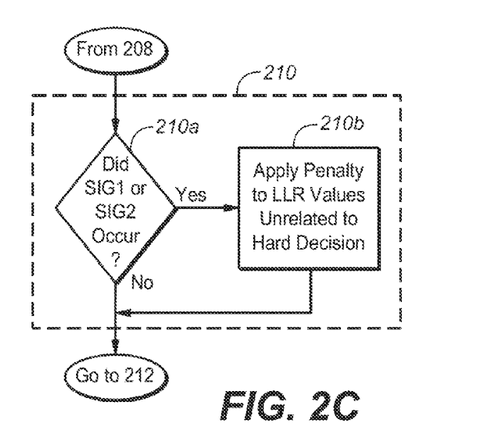
FIG. 2C is a flow diagram of the second rule applied in FIG. 2A.

A particular implementation of step 210 is shown in FIG. 2C, which shows the step 210 in detail as steps 210a and 210b. In particular, step 210a determines whether SIG1 or SIG2 occurred. If it is determined in step 210a that SIG1 or SIG2 did not occur, FIG. 2C illustrates the flow proceeding to step 212 (shown in FIG. 2A). While FIG. 2C illustrates the flow proceeding to step 212, it is contemplated that the flow may alternatively proceed to the start operation or step 202 of FIG. 2A. If it is determined in step 210a that SIG1 or SIG2 did occur, the flow proceeds to step 210b. In step 210b, a penalty is applied to LLR values unrelated to the hard decision of the signature event that occurred. For instance, when SIG1 occurs, the values of LLR0, LLR2, and LLR3 would be adjusted by a penalty value, and when SIG2 occurs, the values of LLR0, LLR1, and LLR3 would be adjusted by a penalty value. After step 210b, the flow proceeds to step 212 (shown in FIG. 2A).

Step 212 involves determining whether a channel condition has changed since the collection of LLR distribution data in step 202. If no channel condition has changed, then no additional action is taken. If a channel condition has changed, then the process flows back to step 202 for new collection of LLR distribution data.

Figure 3:
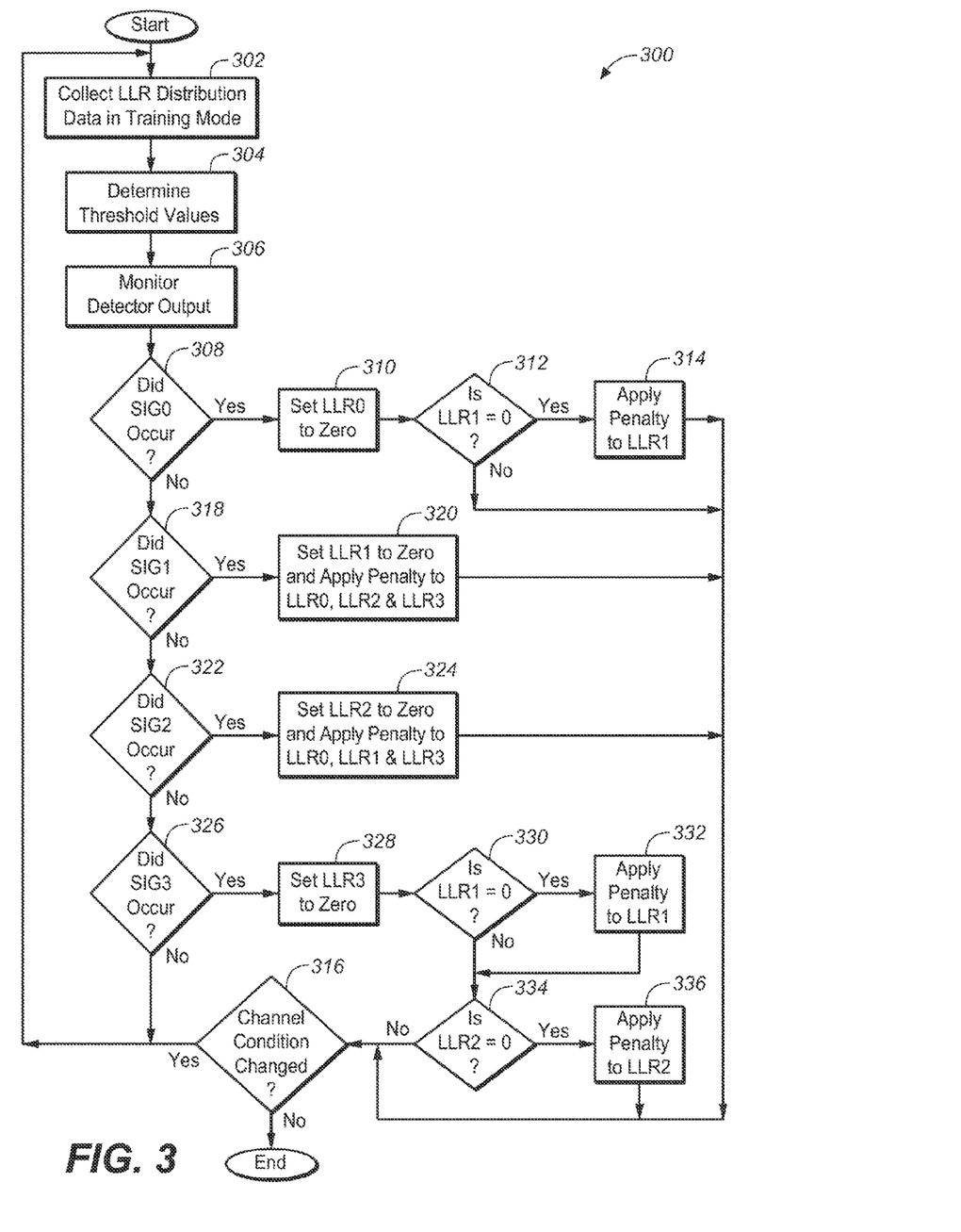
FIG. 3 is a flow diagram for manipulating LLRs from a hard disk drive detector in accordance with another implementation of the present disclosure.

Referring now to FIG. 3, a flow diagram 300 of another implementation of a method for LLR manipulation of a hard disk drive detector output is shown. After a start operation, step 302 collects LLR distribution data. For instance, LLR values from a hard disk drive detector output may be collected to produce an LLR histogram (such as those shown in FIGS. 1A-1D). It is contemplated that the data collection may occur in a training mode, which can be done in a known data mode, where what was written to the hard disk drive is known, or in a normal mode, where decoder output is collected to obtain true data. In a particular implementation, collected data is derived solely from successfully decoded sectors of the hard disk drive. The LLR distribution can be frozen after the training mode (e.g., after obtaining a set of distributions for each zone on the hard disk drive, or the LLR distribution can be updated on the fly with true data from decoder output (e.g., the LLR distribution is updated from sector to sector). Step 304 may determine at least one of a threshold or a threshold range for each symbol of the LLR distribution data based on the set of the LLR distribution data. The threshold values provided herein are explanatory. It is contemplated that other threshold values may occur, where the threshold values presented herein are not the only threshold values possible. Step 306 may monitor an output of the hard disk drive channel detector, where the output includes a plurality of symbols corresponding to the output.

Step 308 determines whether the condition or signature event SIG0 occurred in the collected data. SIG0 is the condition or signature event where the value of LLR2 is less than an LLR2 threshold value (e.g., −20) and the value of LLR3 is less than an LLR3 threshold value (e.g., −20). If it is determined in step 308 that SIG0 occurred, the flow proceeds to step 310, where LLR0 is set to zero (0). From step 310, the flow proceeds to step 312, which determines whether the value of LLR1 is equal to zero. If it is determined in step 312 that LLR1 is equal to zero, the flow proceeds to step 314, where a penalty value is applied to LLR1. For instance, the penalty value may be −4, but it is contemplated that the value of the penalty may differ depending on a desired tolerance level or the like. From step 314, the flow proceeds to step 316, where it is determined if a channel condition has changed since the collection of LLR distribution data in step 302. If no channel condition has changed, then no additional action is taken. If a channel condition has changed, then the process flows back to step 302 for new collection of LLR distribution data. If it is determined in step 312 that LLR1 is not equal to zero, then the flow proceeds to step 316.

If it is determined in step 308 that SIG0 did not occur, the flow proceeds to step 318, where it is determined whether SIG1 occurred. SIG1 is the condition or signature event where the value of LLR0 is less than an LLR0 threshold value (e.g., −20), the value of LLR3 is less than an LLR3 threshold value (e.g., −20), and the value of LLR2 is between a second LLR2 threshold value (e.g., −15) and a third LLR2 threshold value (e.g., −10). If it is determined in step 318 that SIG1 occurred, the flow proceeds to step 320, where LLR1 is set to zero and a penalty is applied to the values of LLR0, LLR2, and LLR3. From step 320, the flow proceeds to step 316. If it is determined in step 318 that SIG1 did not occur, then the flow proceeds to step 322.

In step 322, a determination is made regarding whether SIG2 occurred. SIG2 is the condition or signature event where the value of LLR0 is less than the LLR0 threshold value (e.g., −20), the value of LLR3 is less than the LLR3 threshold value (e.g., −20), and the value of LLR1 is between a first LLR1 threshold value (e.g., −15) and a second LLR1 threshold value (e.g., −10). If it is determined in step 322 that SIG2 occurred, the flow proceeds to step 324, where LLR2 is set to zero and a penalty is applied to the values of LLR0, LLR1, and LLR3. From step 324, the flow proceeds to step 316. If it is determined in step 322 that SIG2 did not occur, then the flow proceeds to step 326.

In step 326, a determination is made regarding whether SIG3 occurred. SIG3 is the condition or signature event where the value of LLR0 is less than a second LLR0 threshold value (e.g., −40) and the value of LLR3 is greater than the LLR3 threshold value (e.g., −30). If it is determined in step 326 that SIG3 occurred, the flow proceeds to step 328, where LLR3 is set to zero. The flow then proceeds to step 330, where it is determined whether the value of LLR1 is equal to zero. If it is determined in step 330 that the value of LLR1 is equal to zero, the flow proceeds to step 332, where a penalty is applied to LLR1. After step 332 or if it is determined in step 330 that the value of LLR1 is not equal to zero, the process flows to step 334, where it is determined whether the value of LLR2 is equal to zero. If it is determined in step 334 that the value of LLR2 is equal to zero, the process flows to step 336, where a penalty is applied to LLR2. After step 336 or if it is determined in step 334 that the value of LLR2 is not equal to zero, the process flows to step 316. If it is determined in step 326 that SIG3 did not occur, the process flows back to the start operation.

Figure 4:
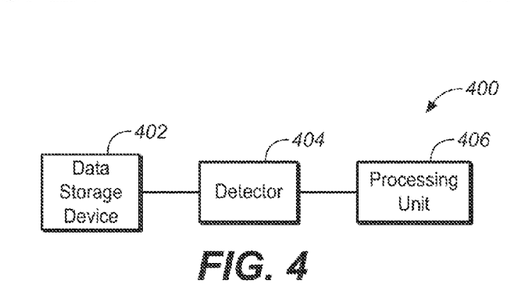
FIG. 4 is a system for pattern-dependent LLR manipulation.

Referring now to FIG. 4, a system 400 for pattern-dependent LLR manipulation is shown. System 400 includes a data storage device 402, a detector 404, and a processing unit 406. In general, system 400 is suitable for performing the example methods outlined in FIGS. 2A-2C and 3. The data storage device may 402 include a hard disk drive as a suitable data storage medium. The detector 404 may suitable to read data from the data storage device 402, such as to provide LLR distribution data. Processing unit 406 may be configured to process the data detected by detector 404, such as to process the LLR distribution data occurring to the methods described herein.

It is to be understood that the present disclosure may be conveniently implemented in forms of a software package. Such a software package may be a computer program product which employs a computer-readable storage medium including stored computer code which is used to program a computer to perform the disclosed function and process of the present invention. The computer-readable medium may include, but is not limited to, any type of conventional floppy disk, optical disk, CD-ROM, magnetic disk, hard disk drive, magneto-optical disk, ROM, RAM, EPROM, EEPROM, magnetic or optical card, or any other suitable media for storing electronic instructions.

It is understood that the specific order or hierarchy of steps in the foregoing disclosed methods are examples of exemplary approaches. Based upon design preferences, it is understood that the specific order or hierarchy of steps in the method can be rearranged while remaining within the scope of the present invention. The accompanying method claims present elements of the various steps in a sample order, and are not meant to be limited to the specific order or hierarchy presented.

It is believed that the present disclosure and many of its attendant advantages will be understood by the foregoing description, and it will be apparent that various changes may be made in the form, construction and arrangement of the components thereof without departing from the scope and spirit of the disclosure or without sacrificing all of its material advantages. The form herein before described being merely an explanatory embodiment thereof, it is the intention of the following claims to encompass and include such changes.

What is claimed is:

1. A method for log likelihood ratio (LLR) manipulation of a hard disk drive detector output, comprising:
   collecting a set of LLR distribution data;
   determining at least one of a threshold or a threshold range for each symbol of the LLR distribution data based on the set of the LLR distribution data;
   monitoring an output of the hard disk drive detector, the output including a plurality of symbols corresponding to the output;
   applying a first rule to each symbol of the plurality of symbols corresponding to the output, the first rule including determining whether one of a plurality of signature events occurred, each signature event of the plurality of signature events including a hard decision for a true value based upon LLR distribution patterns;
   when one of the plurality of signature events is determined to occur, setting a first LLR value of a symbol of the set of LLR distribution data to zero and applying a first penalty value to any other LLR value of the symbol that equals zero;
   applying a second rule to each symbol of the plurality of symbols corresponding to the output, the second rule including determining whether one of the plurality of signature events involves all but one LLR value of the symbol in the hard decision occurred; and
   when one of the plurality of signature events which involves all but one LLR value of the symbol in the hard decision is determined to occur, applying a second penalty value to all LLR values but the one LLR value.

2. The method of claim 1, wherein each symbol corresponding to the output includes an LLR0 value, an LLR1 value, an LLR2 value, and an LLR3 value.

3. The method of claim 2, wherein the plurality of signature events includes a first signature event, a second signature event, a third signature event, and a fourth signature event.

4. The method of claim 3, wherein the first signature event includes the LLR2 value less than an LLR2 threshold value and the LLR3 value less than an LLR3 threshold value.

5. The method of claim 3, wherein the second signature event includes the LLR0 value less than an LLR0 threshold value, the LLR3 value less than—an LLR3 threshold value, and the LLR2 value between a first LLR2 threshold value and a second LLR2 threshold value.

6. The method of claim 3, wherein the third signature event includes the LLR0 value less than an LLR0 threshold value, the LLR3 value less than an LLR3 threshold value, and the LLR1 value between a first LLR1 threshold value and a second LLR1 threshold value.

7. The method of claim 3, wherein the fourth signature event includes the LLR0 value less than an LLR0 threshold value and the LLR3 value greater than an LLR3 threshold value.

8. The method of claim 3, wherein the first signature event, the second signature event, the third signature event, and the fourth signature event are mutually exclusive.

9. The method of claim 1, further comprising:
   determining whether a channel condition of the hard disk drive detector has changed; and
   when the channel condition of the hard disk drive detector is determined to have changed, collecting a second set of LLR distribution data.

10. A computer-readable device having computer-executable instructions for performing a method for log likelihood ratio (LLR) manipulation of a hard disk drive detector output, the method comprising:
    collecting a set of LLR distribution data;

determining at least one of a threshold or a threshold range for each symbol of the LLR distribution data based on the set of the LLR distribution data;

monitoring an output of the hard disk drive detector, the output including a plurality of symbols corresponding to the output;

applying a first rule to each symbol of the plurality of symbols corresponding to the output, the first rule including determining whether one of a plurality of signature events occurred, each signature event of the plurality of signature events including a hard decision for a true value based upon LLR distribution patterns;

when one of the plurality of signature events is determined to occur, setting a first LLR value of a symbol of the set of LLR distribution data to zero and applying a first penalty value to any other LLR value of the symbol that equals zero;

applying a second rule to each symbol of the plurality of symbols corresponding to the output, the second rule including determining whether one of the plurality of signature events involves all but one LLR value of the symbol in the hard decision occurred; and when one of the plurality of signature events which involves all but one LLR value of the symbol in the hard decision is determined to occur, applying a second penalty value to all LLR values but the one LLR value.

11. The computer-readable device of claim 10, each symbol corresponding to the output includes an LLR0 value, an LLR1 value, an LLR2 value, and an LLR3 value.

12. The computer-readable device of claim 11, wherein the plurality of signature events includes a first signature event, a second signature event, a third signature event, and a fourth signature event.

13. The computer-readable device of claim 12, wherein the first signature event includes the LLR2 value less than an LLR2 threshold value and the LLR3 value less than an LLR3 threshold value.

14. The computer-readable device of claim 12, wherein the second signature event includes the LLR0 value less than an LLR0 threshold value, the LLR3 value less than—an LLR3 threshold value, and the LLR2 value between a first LLR2 threshold value and a second LLR2 threshold value.

15. The computer-readable device of claim 12, wherein the third signature event includes the LLR0 value less than an LLR0 threshold value, the LLR3 value less than an LLR3 threshold value, and the LLR1 value between a first LLR1 threshold value and a second LLR1 threshold value.

16. The computer-readable device of claim 12, wherein the fourth signature event includes the LLR0 value less than an LLR0 threshold value and the LLR3 value greater than an LLR3 threshold value.

17. The computer-readable device of claim 12, wherein the first signature event, the second signature event, the third signature event, and the fourth signature event are mutually exclusive.

18. The computer-readable device of claim 10, wherein the method further comprises:

determining whether a channel condition of the hard disk drive detector has changed; and when the channel condition of the hard disk drive detector is determined to have changed, collecting a second set of LLR distribution data.

19. A method for log likelihood ratio (LLR) manipulation of a hard disk drive detector output, comprising:

collecting a set of LLR distribution data;

determining at least one of a threshold or a threshold range for each symbol of the LLR distribution data based on the set of the LLR distribution data;

monitoring an output of the hard disk drive detector, the output including a plurality of symbols corresponding to the output, wherein each symbol includes an LLR0 value, an LLR1 value, an LLR2 value, and an LLR3 value;

determining whether one of a first signature event, a second signature event, a third signature event, or a fourth signature event occurred for a symbol, the first signature event includes the LLR2 value less than an LLR2 threshold value and the LLR3 value less than an LLR3 threshold value, the second signature event includes the LLR0 value less than an LLR0 threshold value, the LLR3 value less than the LLR3 threshold value, and the LLR2 value between a second LLR2 threshold value and a third LLR2 threshold value, the third signature event includes the LLR0 value less than the LLR0 threshold value, the LLR3 value less than the LLR3 threshold value, and the LLR1 value between a first LLR1 threshold value and a second LLR1 threshold value, and the fourth signature event includes the LLR0 value less than a second LLR0 threshold and the LLR3 value greater than the LLR3 threshold value; and when one of the first signature event, the second signature event, the third signature event, or the fourth signature event is determined to occur for the symbol:

determining which one of the first signature event, the second signature event, the third signature event, or the fourth signature event occurred and determining whether LLR0, LLR1, LLR2, or LLR3 is equal to zero; and if the first signature event is determined to occur, setting the LLR0 value to zero, and if LLR1 is determined to equal zero, applying a first penalty value to LLR1, if the second signature event is determined to occur, setting the LLR1 value to zero, and applying a second penalty value to the LLR0 value, the LLR2 value, and the LLR3 value, if the third signature event is determined to occur, setting the LLR2 value to zero, and applying a third penalty value to the LLR0 value, the LLR1 value, and the LLR3 value, and if the fourth signature event is determined to occur, setting the LLR3 value to zero, and if LLR1 is determined to equal to zero, applying a fourth penalty value to LLR1, and if LLR2 is determined to equal to zero, applying a fifth penalty value to LLR2.

20. The method of claim 19, further comprising:

determining whether a channel condition of the hard disk drive detector has changed; and when the channel condition of the hard disk drive detector is determined to have changed, collecting a second set of LLR distribution data.

* * * * *